United States Patent
Zhang et al.

(10) Patent No.: US 11,387,338 B1
(45) Date of Patent: Jul. 12, 2022

(54) METHODS FOR FORMING PLANAR METAL-OXIDE-SEMICONDUCTOR FIELD-EFFECT TRANSISTORS

(71) Applicant: Applied Materials, Inc., Santa Clara, CA (US)

(72) Inventors: Qintao Zhang, Mt. Kisco, NY (US); Samphy Hong, Saratoga Springs, NY (US); Lei Zhong, Austin, TX (US); David Jon Lee, Poughkeepsie, NY (US); Felix Levitov, Ballston Lake, NY (US); Carlos Caballero, Covina, CA (US); Durgaprasad Chaturvedula, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/155,662

(22) Filed: Jan. 22, 2021

(51) Int. Cl.
| | |
|---|---|
| *H01L 21/336* | (2006.01) |
| *H01L 29/423* | (2006.01) |
| *H01L 29/66* | (2006.01) |
| *H01L 29/78* | (2006.01) |

(52) U.S. Cl.
CPC .... *H01L 29/42368* (2013.01); *H01L 29/6656* (2013.01); *H01L 29/66068* (2013.01); *H01L 29/78* (2013.01)

(58) Field of Classification Search
None
See application file for complete search history.

(56) References Cited

U.S. PATENT DOCUMENTS

| | | | | |
|---|---|---|---|---|
| 6,433,371 | B1* | 8/2002 | Scholer | H01L 29/6659 257/E21.205 |
| 6,770,550 | B2* | 8/2004 | Kunikiyo | H01L 29/4941 257/E23.179 |
| 7,843,004 | B2 | 11/2010 | Darwish | |
| 8,129,245 | B2 | 3/2012 | Yedinak et al. | |
| 9,136,266 | B2 | 9/2015 | Yan et al. | |
| 2002/0076885 | A1* | 6/2002 | Chen | H01L 21/823835 438/270 |
| 2004/0137672 | A1* | 7/2004 | Lee | H01L 29/518 257/E21.444 |

(Continued)

FOREIGN PATENT DOCUMENTS

WO    WO 2005/065385 A    7/2005

OTHER PUBLICATIONS

Wei et al., Low ON-Resistance SiC Trench-Planar MOSFET With Reduced OFF-State Oxide Field and Low Gate Charges, Nov. 2016. 4 pages, IEEE Electron Device Letters, vol. 37, No. 11.

(Continued)

*Primary Examiner* — Ali Naraghi
(74) *Attorney, Agent, or Firm* — Moser Taboada (57) ABSTRACT

A method of forming a gate of a planar metal oxide semiconductor field effect transistor (MOSFET) reduces gate-drain capacitance. The method may include forming a first gate dielectric portion of the planar MOSFET with a first thickness that is configured to reduce the gate-drain capacitance of the planar MOSFET, forming a second gate dielectric portion of the planar MOSFET on the substrate with a second thickness less than the first thickness, and forming the gate of the planar MOSFET on the first gate dielectric portion and the second gate dielectric portion on the substrate.

17 Claims, 5 Drawing Sheets

(56) References Cited

U.S. PATENT DOCUMENTS

| | | | | |
|---|---|---|---|---|
| 2005/0158941 A1* | 7/2005 | Lee | ................ | H01L 21/823814 |
| | | | | 438/231 |
| 2007/0069285 A1* | 3/2007 | Takami | ................ | H01L 29/517 |
| | | | | 257/E29.152 |
| 2009/0026555 A1* | 1/2009 | Li | .................... | H01L 29/66636 |
| | | | | 257/408 |
| 2013/0181301 A1* | 7/2013 | Witters | ............ | H01L 29/66477 |
| | | | | 257/408 |

OTHER PUBLICATIONS

Agarwal et al., 2.3 kV 4H—SiC Accomutation-Channel Split-Gate Planar Power MOSFETs With Reduced Gate Charge, May 20, 2020, Journal of the Electron Devices Society, 6 pages. Raleigh, North Carolina.

* cited by examiner

METHODS FOR FORMING PLANAR METAL-OXIDE-SEMICONDUCTOR FIELD-EFFECT TRANSISTORS

FIELD

Embodiments of the present principles generally relate to semiconductor processing of semiconductor substrates.

BACKGROUND

Transistors are semiconductor devices that allow control of a current that flows through the device. The transistor may be used in amplification, switching, and other applications. A low power version of the transistor was developed in the 1950's called the metal-oxide-semiconductor field-effect transistor or MOSFET. The MOSFET has since become the most widely manufactured semiconductor device in history. A MOSFET may be formed as a trench MOSFET or as a much more economical planar MOSFET. As higher densities of transistors are demanded by the manufacturing industry, the scale of the transistor is being constantly reduced, causing problems such as increased switching times and power consumption. The inventors have observed that the issues may be due to increased gate-drain capacitance.

Accordingly, the inventors have provided improved planar MOSFETs with decreased gate-drain capacitance compared to current technologies.

SUMMARY

Methods for forming planar MOSFETs with reduce gate-drain capacitance are provided herein.

In some embodiments, a method of forming a planar metal oxide semiconductor field effect transistor (MOSFET) may comprise depositing a first dielectric layer on a substrate, depositing a hardmask layer on the substrate, forming a first gate dielectric portion of the planar MOSFET in the first dielectric layer on the substrate by patterning and etching the hardmask layer, wherein a hardmask portion remains on the first gate dielectric portion and wherein a first thickness of the first gate dielectric portion is configured to reduce a gate-drain capacitance of the planar MOSFET, depositing a first spacer layer on the substrate, implanting a P-well of the planar MOSFET in the substrate, depositing a second spacer layer on the substrate, forming a second spacer surrounding the first gate dielectric portion and the hardmask portion on the substrate, implanting an N+ source of the planar MOSFET in the substrate, removing the first spacer layer, the second spacer, and the hardmask portion to reveal the first gate dielectric portion on the substrate, forming a second gate dielectric portion of the planar MOSFET on the substrate, and forming a gate of the planar MOSFET on the substrate.

In some embodiments, the method may further include depositing the first dielectric layer using a thermal oxide process, depositing the first dielectric layer using a high temperature oxide process and depositing the second gate dielectric portion using a high temperature oxide process, wherein the hardmask layer is formed from a first material different from a second material of the first dielectric layer, wherein the first material is silicon nitride, depositing the first spacer layer by a high temperature oxide process or by a low-pressure chemical vapor deposition (LPCVD) process, wherein the first spacer layer is silicon nitride deposited by the LPCVD process, wherein the second spacer is formed of a second material different from a first material used to form the hardmask layer, wherein the second material is a polymer-based material or a carbon-based material, wherein the first spacer layer has a second thickness of approximately 150 nm to approximately 300 nm, wherein the second spacer layer has a third thickness of approximately 400 nm to approximately 600 nm, wherein the first spacer layer is a conformal layer, wherein the first thickness is approximately 30 nm to approximately 60 nm, and/or wherein the first spacer layer is configured to reduce gate-drain capacitance by approximately 50%.

In some embodiments, a non-transitory, computer readable medium having instructions stored thereon that, when executed, cause a method for forming a planar silicon carbide (SiC) metal oxide semiconductor field effect transistor (MOSFET) to be performed, the method may comprise depositing a first dielectric layer on a substrate, depositing a hardmask layer on the substrate, forming a first gate dielectric portion of the planar SiC MOSFET in the first dielectric layer on the substrate by patterning and etching the hardmask layer, wherein a hardmask portion remains on the first gate dielectric portion and wherein a first thickness of the first gate dielectric portion is configured to reduce a gate-drain capacitance of the planar SiC MOSFET, depositing a first spacer layer with a second thickness on the substrate, implanting a P-well of the planar SiC MOSFET in the substrate, depositing a second spacer layer on the substrate, forming a second spacer surrounding the first gate dielectric portion and the hardmask portion on the substrate, implanting an N+ source of the planar SiC MOSFET in the substrate, removing the first spacer layer, the second spacer, and the hardmask portion to reveal the first gate dielectric portion on the substrate, forming a second gate dielectric portion of the planar SiC MOSFET with a third thickness on the substrate, and forming a gate of the planar SiC MOSFET on the substrate.

In some embodiments, the method may further include wherein the first thickness is approximately 30 nm to approximately 60 nm, the second thickness is approximately 150 nm to approximately 300 nm, and wherein the third thickness is less than or equal to the first thickness, and/or wherein the first gate dielectric portion and the second gate dielectric portion are formed from deposition using a high temperature oxide process.

In some embodiments, a structure for a planar metal-oxide-semiconductor field-effect transistor (MOSFET) may comprise a silicon-based layer of the planar MOSFET in contact with a drain layer of the planar MOSFET, a junction field-effect transistor (JFET) channel region of the planar MOSFET in the silicon-based layer surrounded by a P-well of the planar MOSFET, a gate dielectric layer of the planar MOSFET formed on the silicon-based layer, the gate dielectric layer has a first portion formed above at least a portion of the JFET channel region and a second portion surrounding the first portion, wherein a first thickness of the first portion is at least approximately 150% of a second thickness of the second portion, and a gate of the planar MOSFET formed on the gate dielectric layer.

In some embodiments, the structure may further include wherein the first thickness of the first portion is approximately 200% of a second thickness of the second portion and/or wherein a ratio of the first thickness of the first portion to the second thickness of the second portion is configured to yield a reduction in gate-drain capacitance.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide a planar metal-oxide-semiconductor field-effect transistor (MOSFET) with reduced gate-drain capacitance ($C_{gd}$). The techniques provided herein may be applied to planar MOSFETS in general (such as silicon planar MOSFET devices and the like) and especially to silicon carbide (SiC) planar MOSFET devices. The techniques allow the planar MOSFETs to be further scaled down in size to increase transistor densities without increasing the $C_{gd}$ in the transistor. The techniques may also be applied to existing MOSFET scaling to enhance performance of the transistor such as increasing switching speeds and/or decreasing switching power through reductions in the $C_{gd}$. The techniques also reduce the $C_{gd}$ without increasing the JFET channel resistance.

Current transistor scaling processes reduce the JFET channel length which in turn increases the JFET resistance of the transistor. The methods used herein will provide the ability to even further reduce the scale of transistors without increasing the JFET resistance. The methods are the only known techniques that reduce the $C_{gd}$ without reducing the gate length (and without increasing JFET resistance) for SiC planar MOSFETs. In some embodiments, a method of the present principles decreases the $C_{gd}$ by increasing the oxide thickness between the gate and the JFET channel area. In a capacitance model, for example, two metal plates are separated by an insulating material. The thickness and the dielectric constant (k) value of the insulating material directly affect the amount of capacitance exhibited by the capacitance model. By altering the thickness of the oxide between the gate and the JFET channel, the distance between the two plates in the capacitance model increases, causing a reduction in capacitance.

Figure 1:
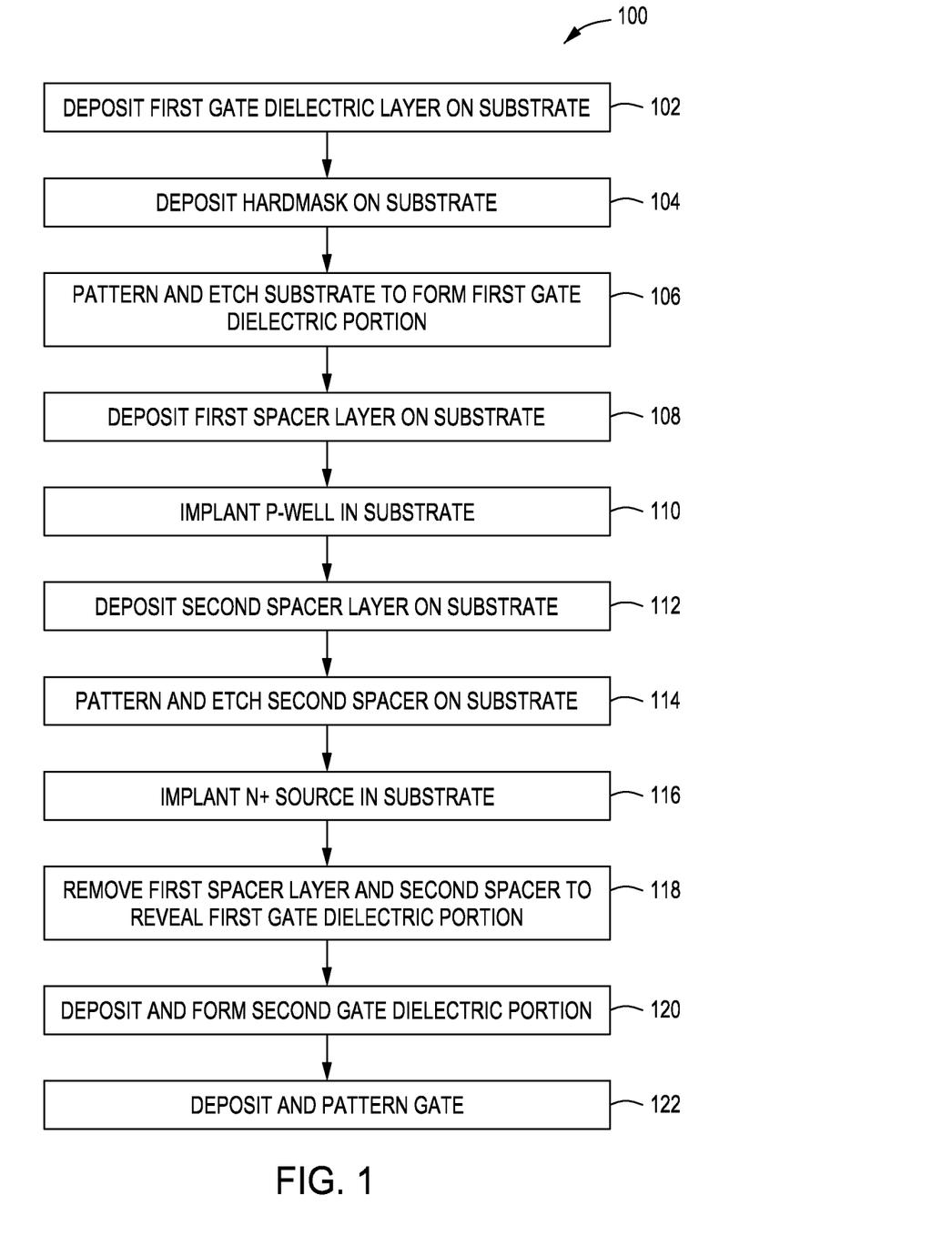
FIG. 1 is a method of forming planar metal-oxide-semiconductor field-effect transistors (MOSFETs) in accordance with some embodiments of the present principles.
Figure 2:
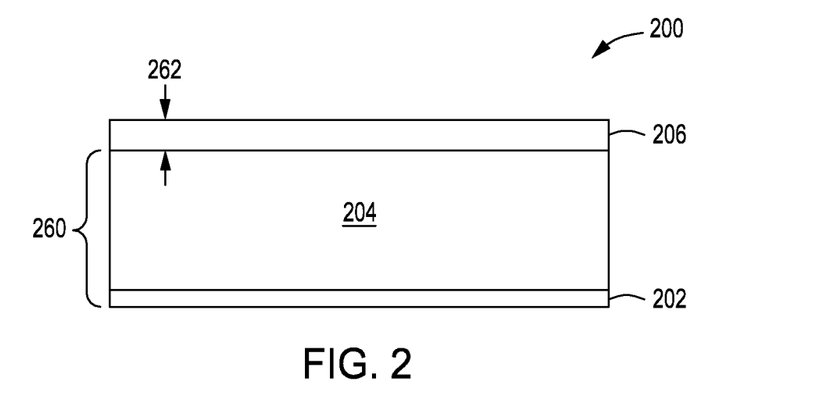
FIG. 2 depicts a cross-sectional view of a first gate dielectric layer on a substrate in accordance with some embodiments of the present principles.

FIG. 1 is a method 100 for forming planar MOSFETs with decreased $C_{gd}$. FIGS. 2-12 are referenced during the description of method 100. In block 102, a first gate dielectric layer 206 is deposited on a substrate 260 as illustrated in a view 200 of FIG. 2. In the example, which is not meant to be limiting, the substrate 260 includes a drain layer 202 and a silicon-based layer 204 such as, for example, but not limited to, an SiC layer. The first gate dielectric layer 206 may be from approximately 30 nm to approximately 60 nm in a first thickness 262. The first thickness 262 of the first gate dielectric layer 206 is configured to provide a decrease in the $C_{gd}$ ranging from approximately 40% to approximately 60% over conventional planar MOSFETs. In some embodiments, the first thickness 262 may be approximately 40 nm to yield an approximately 50% reduction in the $C_{gd}$ for the planar MOSFET. The thickness of the first gate dielectric layer 206 also affects the breakdown voltage and wattage of the planar MOSFET. By adjusting the thickness, a planar MOSFET designer may use the present techniques to tailor the planar MOSFET to the designers application.

The gate dielectric may be deposited using thermal oxide processes or high temperature oxide (HTO) processes and may also receive annealing processes, such as annealing in NO, $N_2O$, $N_2$ at above 1000 degrees Celsius for over 1 hour. The thermal oxide processes have the advantage of low gate leakages and high breakdown voltages. A thermal oxidation process creates an oxidizing atmosphere on the substrate which is heated to further increase the oxidizing of the actual substrate surface which turns into an oxide layer. The thermal oxide process forces the oxidizing agent to diffuse into the substrate at a high temperature and react with the substrate material. The inventors have found that if thermal oxide processes are used, traps or defects may occur when a subsequent second gate dielectric layer (described below) is deposited, creating weakened junction areas between the two gate dielectric portions and reducing performance of the gate oxide.

HTO deposition processes may yield similar performance in terms of gate leakage and breakdown voltage as compared to thermal oxide deposition processes by using after-deposition densification techniques. The after-deposition densification techniques may include, but are not limited to, annealing processes and/or plasma assisted processes and the like. The HTO deposition processes allow multiple gate oxide deposition processes to occur without having defects such as weak points at the junction with prior deposited gate oxides, yielding gate leakage and breakdown voltage performances similar to thermal oxidation processes. Another advantage of HTO processes over thermal oxide processes is the ability to better control the formation of thick oxides. The HTO deposition process may include atomic layer deposition (ALD) or chemical vapor deposition (CVD) processes.

Figure 3:
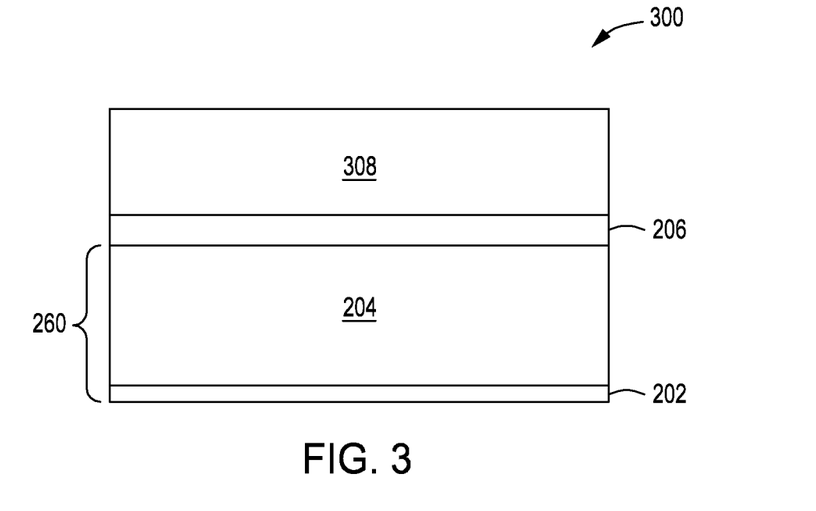
FIG. 3 depicts a cross-sectional view of a hardmask deposited on a substrate in accordance with some embodiments of the present principles.
Figure 4:
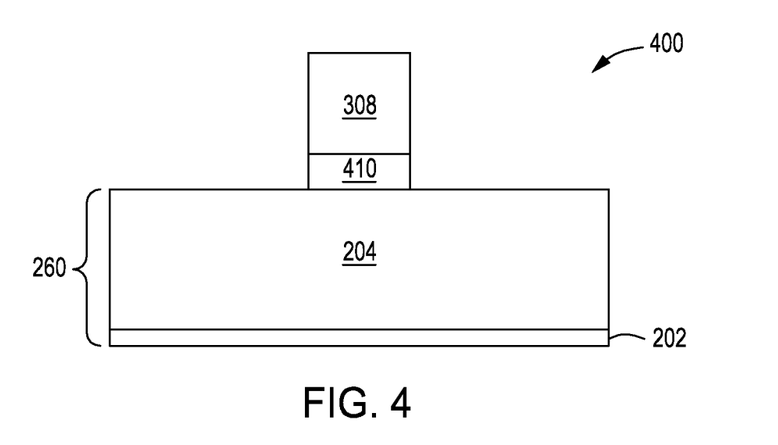
FIG. 4 depicts a cross-sectional view of a first gate dielectric portion of a planar MOSFET with a portion of a hardmask in accordance with some embodiments of the present principles.
Figure 5:
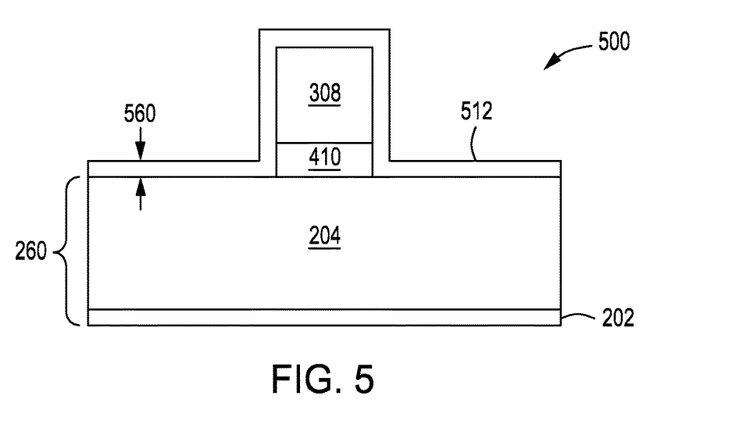
FIG. 5 depicts a cross-sectional view of a first spacer layer deposited on a substrate in accordance with some embodiments of the present principles.

In block 104, a hardmask 308 is deposited on the substrate 260 as depicted in a view 300 of FIG. 3. The hardmask 308 may be a material different from the first gate dielectric layer 206 to allow selectivity in removal during the forming of the planar MOSFET. In some embodiments, the hardmask 308 may be formed from, but not limited to, silicon nitride, polysilicon, and the like. In block 106, the substrate 260 is patterned and etched to form a first gate dielectric portion 410 on the substrate 260 as depicted in a view 400 of FIG. 4. Dry or wet etching techniques may be used to remove unwanted portions of the hardmask 308 and the first gate dielectric layer 206. The remaining portions of the hardmask 308 function to protect the underlying first gate dielectric portion 410 and the JFET channel during subsequent processing. In block 108, a first spacer layer 512 is deposited on the substrate 260 as depicted in a view 500 of FIG. 5. The first spacer layer 512 is an oxide that is deposited by HTO processes or may be silicon nitride deposited by low pressure CVD (LPCVD) processes and the like. The first spacer layer 512 functions as an implantation buffer layer and an etch stop layer for subsequent formation of additional spacers. The first spacer layer 512 may have a thickness 560 of approximately 150 nm to approximately 300 nm. In some embodiments, the first spacer layer 512 may have a thickness 560 of approximately 200 nm. In some embodiments, the first spacer layer 512 is deposited using a conformal deposition process.

Figure 6:
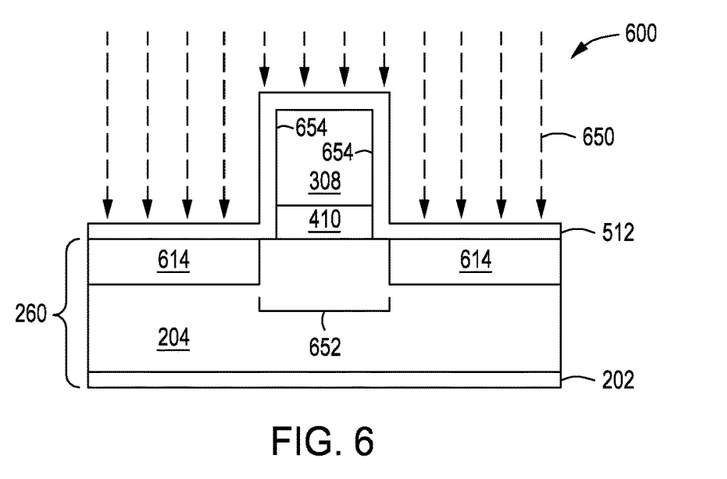
FIG. 6 depicts a cross-sectional view of ion implantation for a P-well formation of a planar MOSFET on a substrate in accordance with some embodiments of the present principles.
Figure 7:
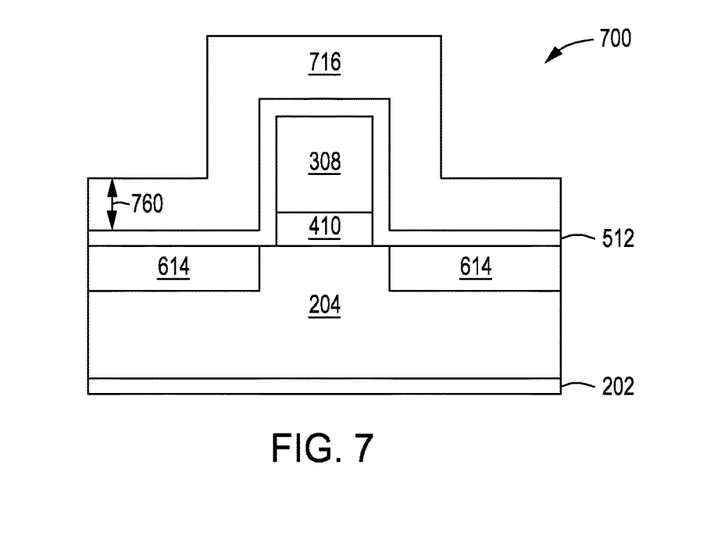
FIG. 7 depicts a cross-sectional view of a second spacer layer on a substrate in accordance with some embodiments of the present principles.

In block 110, a P-well 614 is ion implanted 650 in the substrate 260 as depicted in a view 600 of FIG. 6. A JFET channel region 652 of the substrate 260 is protected by the first gate dielectric portion 410, the portion of the hardmask 308, and the sidewall portions 654 of the first spacer layer 512 and is not implanted. In block 112, a second spacer layer 716 is deposited on the substrate 260 as depicted in a view 700 of FIG. 7. The second spacer layer 716 is a material that is different from the material used for the hardmask 308 and the first gate dielectric portion 410 such as, but not limited to, a polymer-based material, a carbon-based material, $SiO_2$, $Si_3N_4$ and the like. The difference in materials allows for selective removal of the second spacer layer 716 without affecting the other layers and/or materials. The second spacer layer 716 may have a thickness 760 of approximately 300 nm to approximately 600 nm. In some embodiments, the second spacer layer 716 may have a thickness 760 of approximately 500 nm. In some embodiments, the second spacer layer 716 is deposited using a conformal deposition process.

Figure 8:
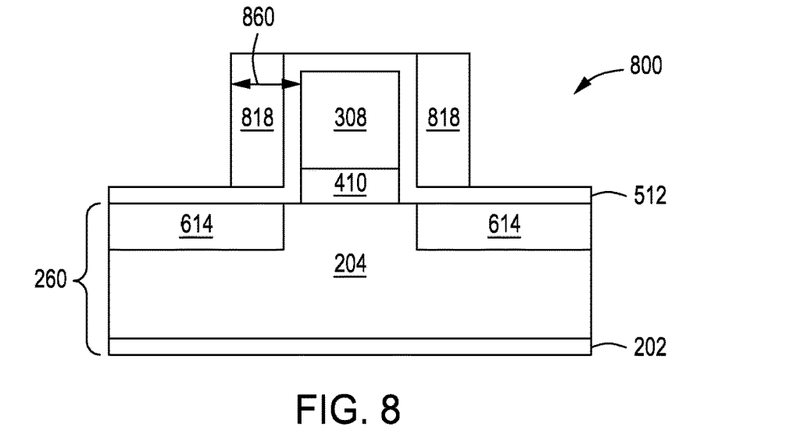
FIG. 8 depicts a cross-sectional view of a second spacer on a substrate in accordance with some embodiments of the present principles.
Figure 9:
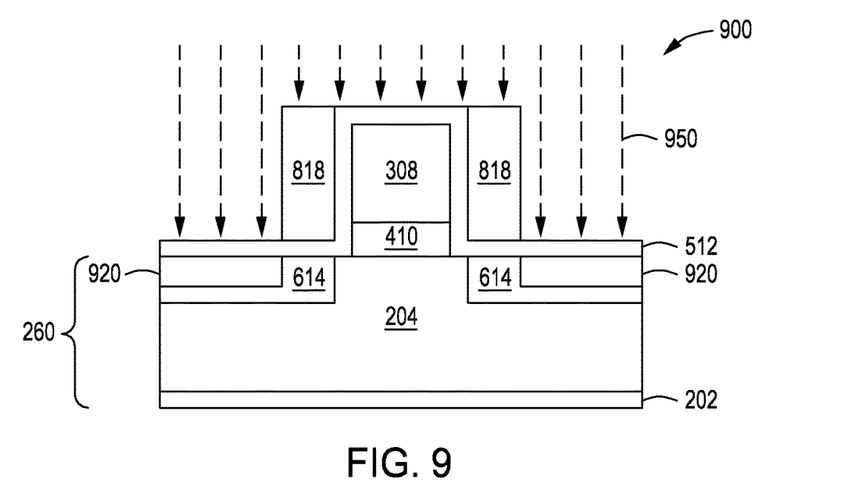
FIG. 9 depicts a cross-sectional view of ion implantation for an N+ formation area of a planar MOSFET on a substrate in accordance with some embodiments of the present principles.
Figure 10:
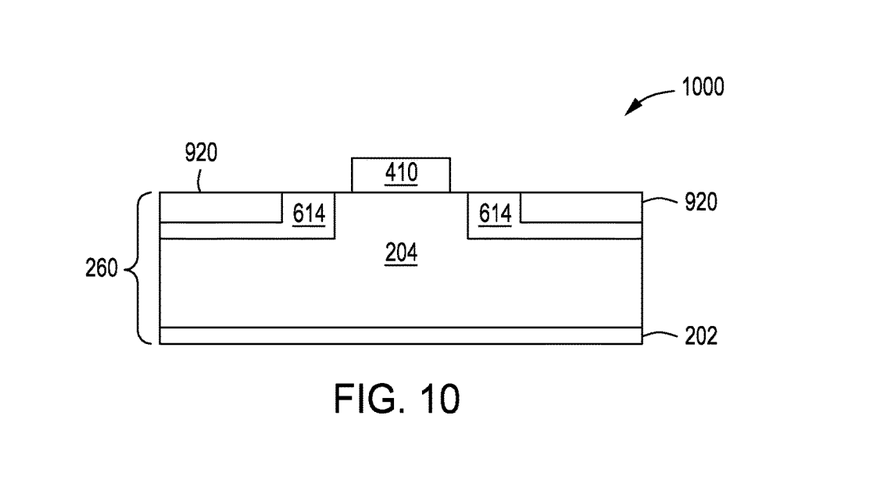
FIG. 10 depicts a cross-sectional view of a formation of a first gate dielectric portion of a planar MOSFET on a substrate in accordance with some embodiments of the present principles.

In block 114, a second spacer 818 is formed by patterning and etching the substrate 206 as depicted in a view 800 of FIG. 8. During the etching of the second spacer 818, the first spacer layer 512 is used as an etch stop. The thickness 760 of the second spacer 818 and the thickness 560 of sidewalls of the first spacer layer 512 determine the offset 860 for the N+ source ion implantation into the P-well 614. In block 116, an N+ source 920 is ion implanted 950 in the substrate 260 as depicted in a view 900 of FIG. 9. As just mentioned, the N+ source ion implantation is restricted by the first gate dielectric portion 410, the portion of the hardmask 308, the first spacer layer 512, and the second spacer 818. In block 118, the first spacer layer 512 and the second spacer 818 are removed to reveal the first gate dielectric portion 410 as depicted in a view 1000 of FIG. 10. Because the first spacer layer 512 acts as an etch stop layer, the second spacer 818 can be selectively removed first to expose the first spacer layer 512. The first spacer layer 512 can then be selectively etched to remove the first spacer layer 512, exposing the first gate dielectric portion 410.

Figure 11:
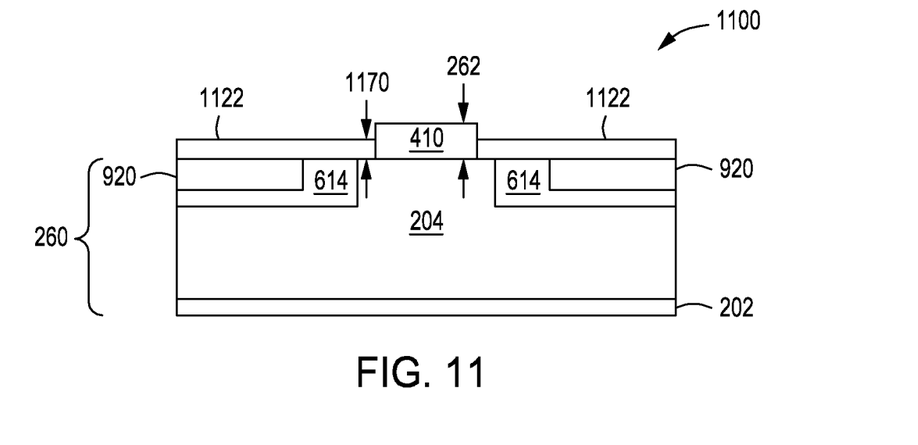
FIG. 11 depicts a cross-sectional view of a formation of a second gate dielectric portion of a planar MOSFET on a substrate in accordance with some embodiments of the present principles.

In block 120, a second gate dielectric portion 1122 is deposited and formed as depicted in a view 1100 of FIG. 11. The second gate dielectric portion 1122 is deposited using an HTO, ALD deposition process, similar to that which can be used for depositing the first gate dielectric portion 410 or thermally grown. The second gate dielectric portion 1122 may have a thickness 1170 of less than or equal to the first thickness 262 of the first gate dielectric portion 410. In some embodiments, the first thickness 262 of the first gate dielectric portion 410 may be approximately 200% of the thickness 1170 of the second gate dielectric portion 1122. For example, with a given oxide as the dielectric, a 200% increase in thickness may yield a 50% reduction in $C_{gd}$ for the planar MOSFET. As described previously, a capacitance value is not only determined based on separation, the capacitance is also based on the k value (dielectric constant) of the dielectric material. In some embodiments, the first thickness 262 of the first gate dielectric portion 410 may be at least approximately 150% of the thickness 1170 of the second gate dielectric portion 1122. In some embodiments, the first thickness 262 of the first gate dielectric portion 410 may be approximately 150% to approximately 300% of the thickness 1170 of the second gate dielectric portion 1122. The ratio of the first thickness 262 of the first gate dielectric portion 410 to the thickness 1170 of the second gate dielectric portion 1122 may be adjusted to compensate for a dielectric constant of a new gate dielectric material and/or adjusted based on the amount of decrease in $C_{gd}$ that is desired for a given application. In some embodiments, the material of the first gate dielectric portion 410 and the material of the second gate dielectric portion 1122 may be the same or may be different. In block 122, a gate 1224 is deposited and patterned on the substrate 260 as depicted in a view 1200 of FIG. 12. The gate 1224 may be formed from a polymer-based material and the like. During formation of the gate 1224 a portion of the second gate dielectric portion 1122 may be removed leaving a reduced second gate dielectric portion 1226.

Figure 12:
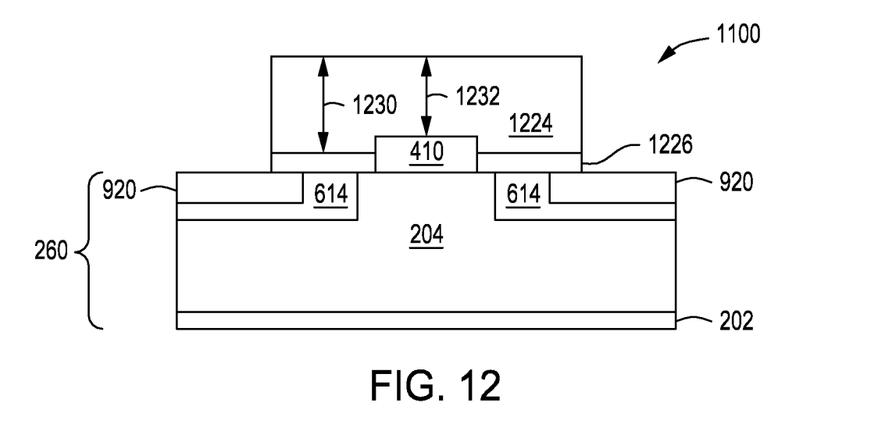
FIG. 12 depicts a cross-sectional view of a formation of a gate of a planar MOSFET on a substrate in accordance with some embodiments of the present principles.

In some embodiments, the height 1230 of the gate 1224 may be approximate 400 nm and thicker. The reduced height 1232 of the gate 1224, caused by the first gate dielectric portion 410, has negligible impact on the gate 1224 but yields a substantial performance improvement on the planar MOSFET by dramatically reducing the $C_{gd}$ of the planar MOSFET. A lower $C_{gd}$ allows for further scaling down with similar performance specifications or increased switching speeds and lower switching power requirements if scaling is maintained. For either situation, the JFET resistance remains unchanged. For the sake of brevity, further annealing processes for densification of layers, and follow on front end of line (FEOL) processes to complete the planar MOSFET are left out of the description. One skilled in the art will understand how to implement such annealing processes and how to complete contacts and/or other aspects of the planar MOSFET in FEOL processes without affecting the benefits brought by the reduced $C_{gd}$ for the planar MOSFET.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of forming a planar metal oxide semiconductor field effect transistor (MOSFET), comprising:
    depositing a first dielectric layer on a substrate;
    depositing a hardmask layer on the substrate;
    forming a first gate dielectric portion of the planar MOSFET in the first dielectric layer on the substrate by patterning and etching the hardmask layer, wherein a hardmask portion remains on the first gate dielectric portion and wherein a first thickness of the first gate dielectric portion is configured to reduce a gate-drain capacitance of the planar MOSFET;
    depositing a first spacer layer on the substrate;
    implanting a P-well of the planar MOSFET in the substrate;
    depositing a second spacer layer on the substrate;
    forming a second spacer surrounding the first gate dielectric portion and the hardmask portion on the substrate;
    implanting an N+ source of the planar MOSFET in the substrate;
    removing the first spacer layer, the second spacer, and the hardmask portion to reveal the first gate dielectric portion on the substrate;
    forming a second gate dielectric portion of the planar MOSFET on the substrate; and
    forming a gate of the planar MOSFET on the substrate.

2. The method of claim 1, further comprising:
    depositing the first dielectric layer using a thermal oxide process.

3. The method of claim 1, further comprising:
    depositing the first dielectric layer using a high temperature oxide process; and
    depositing the second gate dielectric portion using a high temperature oxide process.

4. The method of claim 1, wherein the hardmask layer is formed from a first material different from a second material of the first dielectric layer.

5. The method of claim 4, wherein the first material is silicon nitride.

6. The method of claim 1, further comprising:
    depositing the first spacer layer by a high temperature oxide process or by a low-pressure chemical vapor deposition (LPCVD) process.

7. The method of claim 6, wherein the first spacer layer is silicon nitride deposited by the LPCVD process.

8. The method of claim 1, wherein the second spacer is formed of a second material different from a first material used to form the hardmask layer.

9. The method of claim 8, wherein the second material is a polymer-based material or a carbon-based material.

10. The method of claim 1, wherein the first spacer layer has a second thickness of approximately 150 nm to approximately 300 nm.

11. The method of claim 1, wherein the second spacer layer has a third thickness of approximately 400 nm to approximately 600 nm.

12. The method of claim 1, wherein the first spacer layer is a conformal layer.

13. The method of claim 1, wherein the first thickness is approximately 30 nm to approximately 60 nm.

14. The method of claim 1, wherein the first spacer layer is configured to reduce gate-drain capacitance by approximately 50%.

15. A non-transitory, computer readable medium having instructions stored thereon that, when executed, cause a method for forming a planar silicon carbide (SiC) metal oxide semiconductor field effect transistor (MOSFET) to be performed, the method comprising:
    depositing a first dielectric layer on a substrate;
    depositing a hardmask layer on the substrate;
    forming a first gate dielectric portion of the planar SiC MOSFET in the first dielectric layer on the substrate by patterning and etching the hardmask layer, wherein a hardmask portion remains on the first gate dielectric portion and wherein a first thickness of the first gate dielectric portion is configured to reduce a gate-drain capacitance of the planar SiC MOSFET;
    depositing a first spacer layer with a second thickness on the substrate;
    implanting a P-well of the planar SiC MOSFET in the substrate;
    depositing a second spacer layer on the substrate;
    forming a second spacer surrounding the first gate dielectric portion and the hardmask portion on the substrate;
    implanting an N+ source of the planar SiC MOSFET in the substrate;
    removing the first spacer layer, the second spacer, and the hardmask portion to reveal the first gate dielectric portion on the substrate;
    forming a second gate dielectric portion of the planar SiC MOSFET with a third thickness on the substrate; and
    forming a gate of the planar SiC MOSFET on the substrate.

16. The non-transitory, computer readable medium of claim 15, wherein the first thickness is approximately 30 nm to approximately 60 nm, the second thickness is approximately 150 nm to approximately 300 nm, and wherein the third thickness is less than or equal to the first thickness.

17. The non-transitory, computer readable medium of claim 15, wherein the first gate dielectric portion and the second gate dielectric portion are formed from deposition using a high temperature oxide process.

* * * * *